United States Patent
You et al.

(10) Patent No.: US 7,189,661 B2
(45) Date of Patent: Mar. 13, 2007

(54) METHOD OF FORMING SILICON OXYNITRIDE LAYER IN SEMICONDUCTOR DEVICE AND APPARATUS OF FORMING THE SAME

(75) Inventors: Young-Sub You, Gyeonggi-do (KR); Cheol-Kyu Yang, Gyeonggi-do (KR); Woong Lee, Seoul (KR); Jae-Chul Lee, Gyeonggi-do (KR); Hun-Hyeoung Leam, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/181,213

(22) Filed: Jul. 13, 2005

(65) Prior Publication Data

US 2006/0063391 A1    Mar. 23, 2006

(30) Foreign Application Priority Data

Sep. 23, 2004  (KR)  ................ 10-2004-0076243

(51) Int. Cl.
*H01L 21/469* (2006.01)
*H01L 21/31* (2006.01)

(52) U.S. Cl. ............... 438/769; 438/775; 438/474; 438/798; 118/723 R; 257/E21.001

(58) Field of Classification Search ........... 438/769, 438/798, 775, 474; 118/723 R
See application file for complete search history.

(56) References Cited

U.S. PATENT DOCUMENTS

| | | | | |
|---|---|---|---|---|
| 5,516,283 A | * | 5/1996 | Schrems | .............. 432/241 |
| 5,817,549 A | * | 10/1998 | Yamazaki et al. | .......... 438/166 |
| 6,124,217 A | * | 9/2000 | Sun et al. | .............. 438/778 |
| 6,140,024 A | * | 10/2000 | Misium et al. | ............ 430/314 |
| 6,450,116 B1 | * | 9/2002 | Noble et al. | ............ 118/723 R |
| 6,468,926 B1 | | 10/2002 | Irino et al. | |
| 6,607,987 B2 | * | 8/2003 | Donohoe | ............... 438/710 |
| 6,683,010 B1 | | 1/2004 | Lim et al. | |
| 6,740,555 B1 | * | 5/2004 | Tews et al. | .............. 438/242 |
| 2003/0068437 A1 | | 4/2003 | Nakamura et al. | |
| 2003/0170956 A1 | * | 9/2003 | Zhong et al. | ............. 438/287 |

FOREIGN PATENT DOCUMENTS

JP         5-251428         9/1993

OTHER PUBLICATIONS

English language abstract of Japanese Publication No. 5-251428.

\* cited by examiner

*Primary Examiner*—Michelle Estrada
*Assistant Examiner*—Nicholas J. Tobergte
(74) *Attorney, Agent, or Firm*—Marger Johnson & McCollom, P.C.

(57) ABSTRACT

There are provided a method and an apparatus of forming an insulating layer including silicon oxynitride. The method includes performing a plasma treatment process for supplying a plasma reaction gas to a substrate to be treated after completing the annealing process. The apparatus includes a sealed processing room having gas supply and exhaust lines running thereto. A quartz inner tube and quartz inlet pipe both include holes therethrough, but in orthogonal directions to one another, to flow a reaction gas onto the wafers loaded within the sealed processing room.

14 Claims, 4 Drawing Sheets

METHOD OF FORMING SILICON OXYNITRIDE LAYER IN SEMICONDUCTOR DEVICE AND APPARATUS OF FORMING THE SAME

CROSS-REFERENCE TO RELATED APPLICATION

This application claims the benefit of Korean Patent Application No. 10-2004-0076243, filed Sep. 23, 2004, the disclosure of which is hereby incorporated herein by reference in its entirety.

BACKGROUND OF THE INVENTION

1. Technical Field

The present invention relates to a method of forming an insulating layer having silicon oxynitride and an apparatus of forming the same.

2. Discussion of Related Art

Semiconductor devices typically include a gate insulating layer formed of silicon oxide. As such devices become smaller and more highly integrated, problems arise from the corresponding decrease in thickness of the silicon oxide layer. That is, with thinner silicon oxide layers being used in smaller semiconductor devices, the useful electrical characteristics of the device are more difficult to maintain. Additionally, thin gate insulating layers may undergo undesired penetration through the insulting layer and to the substrate by a high density dopant boron (B) from a p-type ($p^+$) polysilicon electrode during an annealing process.

It is thought that the deterioration of the electrical characteristic in the device is due to dangling bonds existing at the interface between an oxide layer and a silicon layer and interfering with the electrical layer property of the oxide layer. Because of this, it is known that the layer property can be improved by oxidizing the surface of the silicon layer to form an oxide layer, and annealing at high temperature in the presence of a nitrogen gas ($N_2$) atmosphere or an atmosphere of a mixture gas including nitrogen gas and ammonia gas. Using such high temperatures (e.g. $\geqq 1000°$ C.) in the semiconductor manufacturing process, however, increases the thermal budget in the formed layer.

To partially address this problem, Japanese Patent Publication No. 93-251428 (Patent No. 2793416) discloses a lamp heating type and sheet-type processing apparatus capable of rapidly heating the structure and thereby forming a silicon oxynitride layer on the oxide layer. The device and method disclosed dry-oxidizes a silicon substrate to form a silicon oxide layer, and then treating the oxide layer with an oxidation gas including nitrogen to form the silicon oxynitride layer. More specifically, the silicon substrate is loaded inside a processing room, and oxidation gas not including nitrogen (e.g. dried oxygen gas ($O_2$)) is flowed to heat the silicon substrate to a temperature of about 1000° C. for oxidation treatment, thereby forming a silicon oxide layer. The substrate undergoes rapid heating using an infrared lamp with a temperature increase in the range of 50 to 200° C./sec. The time of maintaining the oxidation conditions, with temperature of 1000° C. and pressure of about 760 Torr, is set about 10 seconds. Thereafter, the processing room is maintained at the same temperature and vacuum-exhausted, and oxidation gas including nitrogen is flowed into the processing room to treat the silicon oxide layer, thereby changing the silicon oxide layer to the silicon oxynitride layer. Here, the oxidation gas including nitrogen is composed of at least one gas selected from the group consisting of nitrogen oxide (NO), nitrogen dioxide ($NO_2$) and nitrous oxide ($N_2O$). The oxynitridation treatment is performed at a temperature of 1000° C., and at a pressure of about 760 Torr, for about 30 seconds.

Use of rapid heating, as disclosed in Japanese Patent Publication No. 93-251428, the addresses the thermal budget problem inherent with other methods. However, this method is not generally suitable to forming an insulating thin film in a highly-integrated semiconductor device, especially those using a sheet-type processing apparatus.

SUMMARY OF THE INVENTION

Therefore, the present invention is directed to provide a method of fabricating a semiconductor device and an apparatus of fabricating the same.

Another object of the present invention is to provide a high production yield method and an apparatus for forming a high quality, thin insulating layer including silicon oxynitride.

Still another object of the present invention is to provide a method and an apparatus of forming a thin insulating layer including silicon oxynitride, using a plasma reaction gas.

Still another object of the present invention is to provide a method and an apparatus of forming a silicon oxynitride layer for shortening process time and improving the production yield.

Exemplary embodiments of the present invention provide a method of forming an insulating layer including silicon oxynitride, and the method includes increasing a predetermined initial temperature up to a first treatment temperature, when a substrate to be treated is loaded into a processing room, with an atmosphere of the processing room maintained with a first pressure; supplying a first treatment gas for performing an oxidation reaction into the processing room to form a silicon oxide layer on a silicon layer on the substrate to be treated, with an atmosphere of the processing room maintained at the first treatment temperature, and oxidizing the surface of the silicon layer; increasing a temperature of the processing room up to a second treatment temperature after the silicon oxide layer is formed, and supplying a second treatment gas for performing a nitridation inside the processing room, to perform an annealing process, thereby changing a portion of the silicon oxide layer to silicon oxynitride; and decreasing a temperature of the processing room to a third treatment temperature after the annealing process, and supplying a third treatment plasma gas into the processing room with the atmosphere of the processing room maintained with a second pressure, and performing a plasma treatment process for changing the silicon oxide layer, a portion of which is changed to silicon oxynitride, further to silicon oxynitride.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention. Like numbers refer to like elements.

Figure 1:
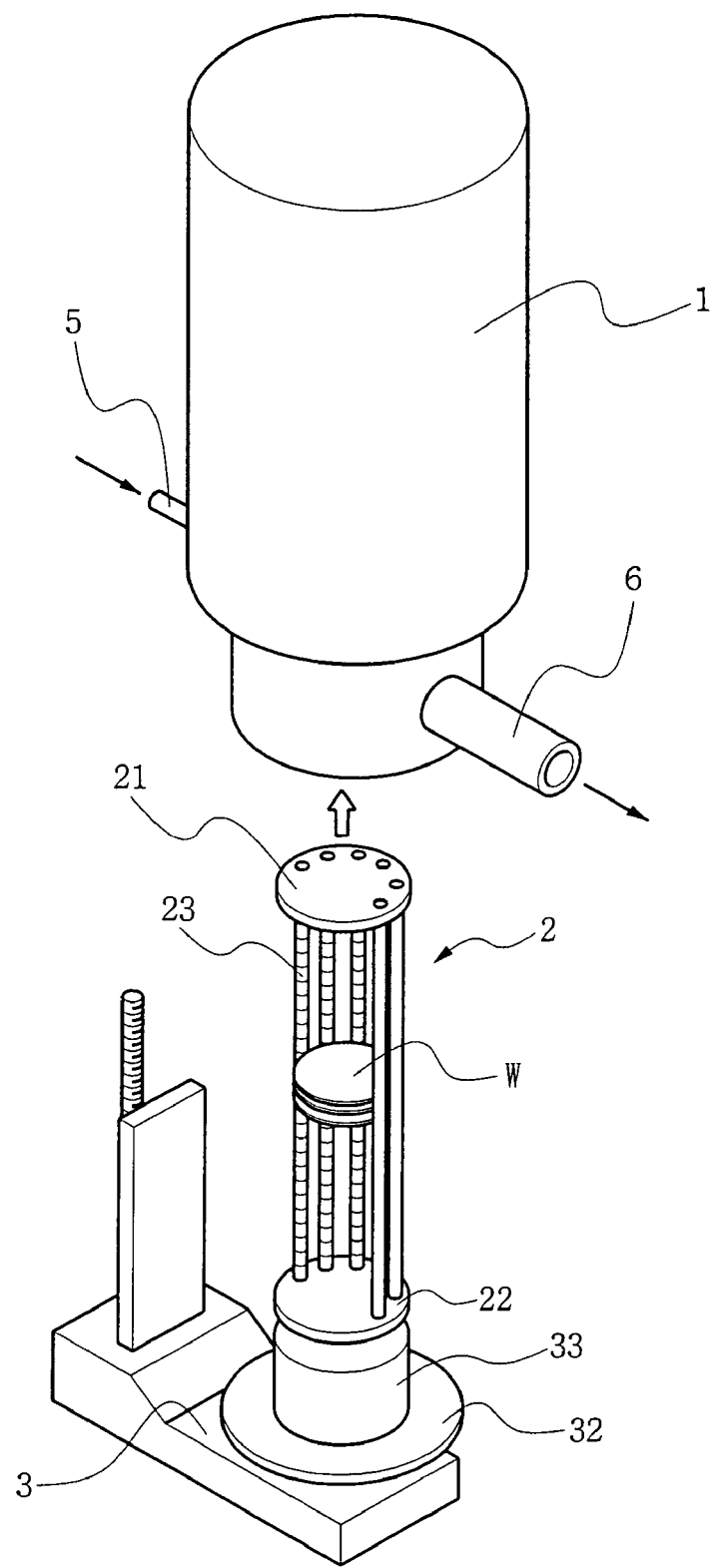
FIG. 1 is a perspective view illustrating a vertical annealing apparatus employed to form a silicon oxynitride layer according to the present invention.
Figure 2:
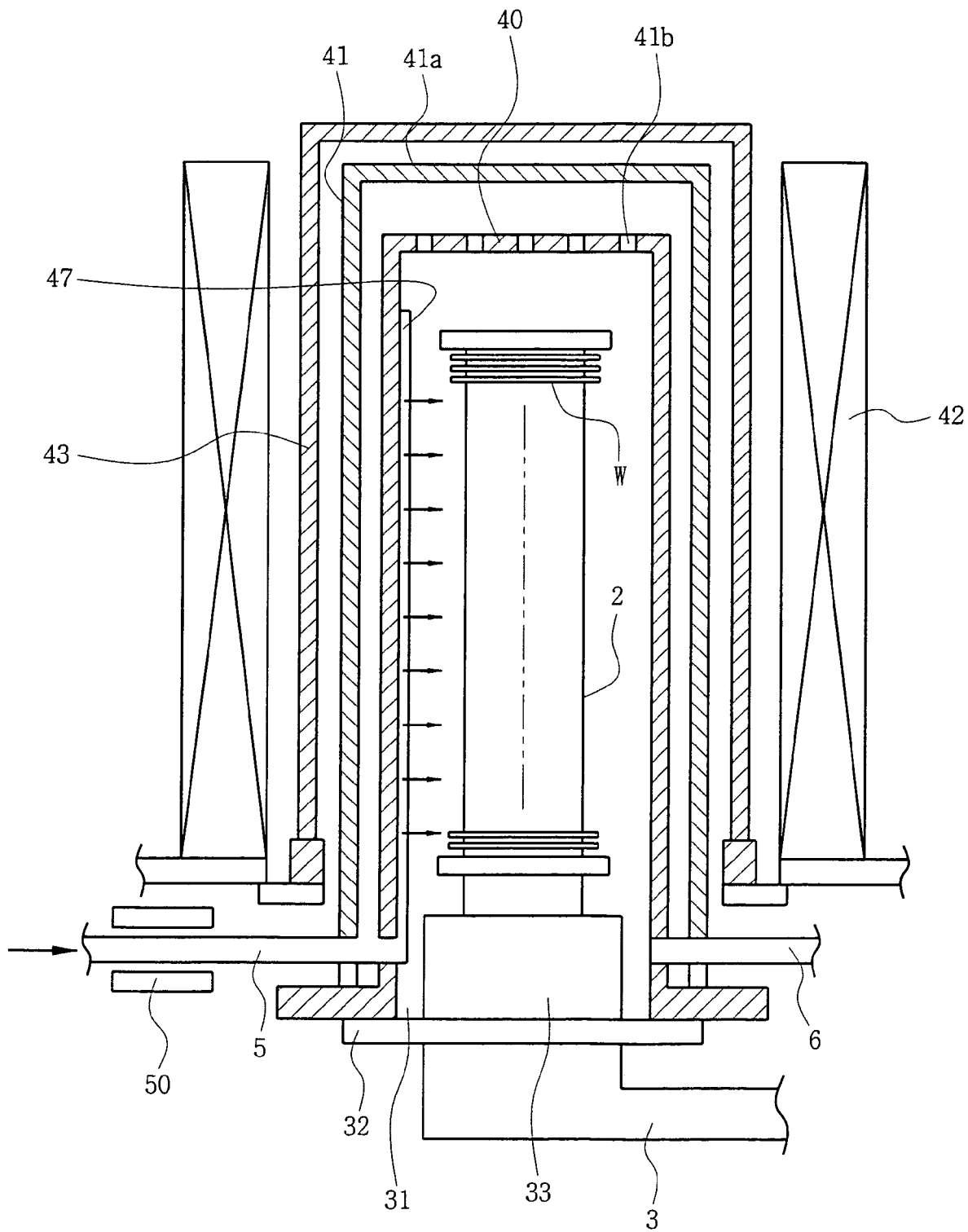
FIG. 2 is a sectional view illustrating the vertical annealing apparatus of FIG. 1.

FIGS. 1 and 2 are a perspective view and a sectional view schematically illustrating a vertical annealing apparatus employed to form a silicon oxynitride layer according to the present invention.

Referring to FIGS. 1 and 2, the apparatus includes a sealed reaction conduit, that is, a vertical annealing furnace 1 having a processing room 41 and a heater 42 surrounding the processing room 41. The processing room 41 has a double structure being composed of, for example, a quartz outer tube 41a and a quartz inner tube 41b. A plurality of holes 40 are formed on top of the inner tube 41b, so that the outer tube 41a and the inner tube 41b are in gaseous communication through the holes 40. A gas supply conduit 5 is connected to the lower sidewall of the outer tube 41a, and an exhaust conduit 6 is connected to the lower sidewall of the inner tube 41b. A pump system (not shown) is connected to the exhaust conduit 6. A plasma system is structured such that a pair of electrodes 50 facing each other are installed around the gas supply conduit 5, and a HF signal voltage from a HF signal generator (not shown) between the electrodes 50 is applied to convert a reaction gas supplied into the processing room 41 into a plasma. The plasma system can also be provided in a different structure.

A portion of the reaction gas supplied from the gas conduit 5 is introduced between the outer tube 41a and the inner tube 41b, and is supplied through the holes 40 on top of the inner tube 41b so as to be introduced onto the surface of the wafers W. Further, a portion of the reaction gas supplied from the gas conduit 5 is introduced into an inlet pipe (injector) 47 being composed of a quartz conduit having many holes in the horizontal direction. The introduced reaction gas flows horizontally through the holes of the inlet pipe 47 onto the surfaces of the vertically overlapped wafers W in a parallel direction. The introduced reaction gas is therefore uniformly introduced onto the surfaces of all of the wafers W inside the processing room 41. Then, after the reaction, the gas is exhausted out of the exhaust conduit 6 through between the quartz outer tube 41a and the quartz inner tube 41b.

The processing room 41 is surrounded by a container 43 to prevent leakage in case cracks form in the inner structures, and a heater 42 is disposed outside the container 43 to heat the atmosphere inside the processing room 41.

A wafer boat 2 having 60 to 150 sheets of wafers vertically aligned therein is moved in the vertical direction to be loaded/unloaded such that the semiconductor wafers W are treated in batch type inside the quartz inner tube 41b.

The wafers W placed in the wafer boat 2 are loaded from an opening 31 on the lower side of the processing room 41 by a boat lift 3, and is unloaded after treatment.

The wafer boat 2 includes an upper plate 21, a bottom plate 22, and a plurality of poles 23 connecting the upper plate 21 and the bottom plate 22. Each pole 23 has a plurality of recesses vertically spaced from each other with a predetermined interval, and horizontal support levels for the wafers are defined by the recesses. By inserting the peripheral edge of the wafer W into the recesses of the pole 23, a plurality of wafers W are aligned in the vertical direction with spacing between each of the wafers so that exposed surfaces of the wafers are treated as described below.

The wafer boat 2 is mounted on a heat insulating barrel 33 provided on a cover 32 opening/closing the opening 31 on the lower side of the processing room 41. The cover 32 is installed to the boat lift 3, and the boat lift 3 lifts the cover 32 up and down to load/unload the wafer boat 2 relative to the processing room 41.

When using the vertical annealing apparatus for forming a silicon oxynitride layer according to the present invention, a reaction gas is sprayed from the upper portion of the processing room 41 onto the wafers W. A reaction gas is introduced through the inlet pipe 47 (injector) onto the surfaces of the wafers W in the parallel direction so that the gas is uniformly introduced onto the surfaces of the wafers W. This is in comparison with the conventional vertical annealing apparatus which supplies a reaction gas in only one direction. Accordingly, the present apparatus can shorten process times and thus improve productivity.

Further, a supplied gas can be made into plasma if necessary, thereby lowering a process temperature, by providing a plasma system around the gas conduit 5.

Hereinafter, a method of forming an insulating layer according to the present invention, using the vertical annealing apparatus described as above will be described in reference to FIG. 3. However, the method of forming an insulating layer according to the present invention may be performed using a conventional vertical annealing apparatus.

Figure 3:
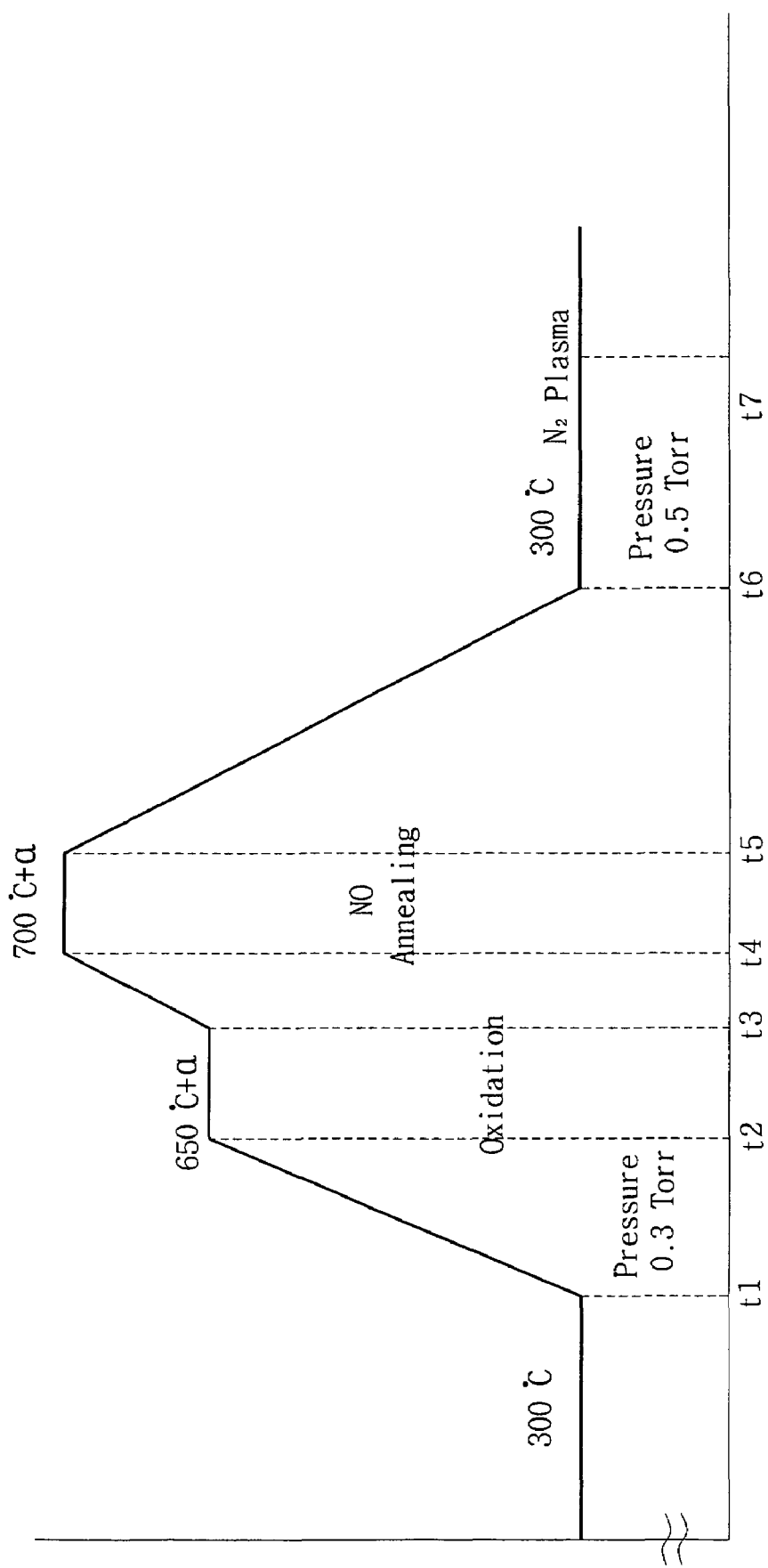
FIGS. 3 and 4 are graphs illustrating the processing conditions for forming a silicon oxynitride layer according to first and second embodiments.

FIG. 3 is a diagram illustrating a temperature of the atmosphere inside a processing room and supply/stop states of a processing gas in accordance with time.

After loading a wafer W into a processing room 41 at time t1, the temperature inside the processing room 41 is increased. Over this process, the inside of the processing chamber 41 is maintained with a predetermined pressure, for example, 0.3 Torr.

When the inner temperature of the processing room 41 is a first treatment temperature, 650° C. or higher, for example, a point t2 of 650° C., an oxidation process as a first treatment process is performed. In the oxidation process, a first treatment gas is flowed into the processing chamber 41 to perform an oxidation. Thus, the surface of a silicon layer on the wafer W is oxidized, thereby forming a silicon oxide layer.

When the oxidation process is ended at a point t3, the atmosphere inside the processing room 41 is heated up to a temperature of a second treatment temperature. When the temperature of the processing room 41 is a second treatment temperature, 700° C. or higher, for example, a point t4 of 750° C., an annealing process on the wafer W is performed. In the annealing process, a second treatment gas is flowed into the processing chamber 41 to perform a nitridation including nitrogen oxide gas (NO). In this embodiment, the second treatment gas is composed of only nitrogen oxide gas.

By the annealing process, nitrogen penetrates through into the oxide layer, and dangling bond formed in the previous oxidation step at the interface of the silicon wafer W and the oxide layer, that is, the $SiO_2$/Si interface, is ended by the nitrogen. That is, at least a portion of the silicon oxide layer near the interface is changed to silicon oxynitride.

At a point t5 when the annealing process is ended, the supply of the nitrogen oxide gas is stopped. Then, the nitrogen oxide gas is exhausted, and the inner temperature of the processing room 41 is decreased to a third treatment temperature, for example, 300° C. (t6). Then, the processing room 41 is maintained with a pressure of 0.5 Torr or lower, and silicon oxynitride is formed on the wafer using a third treatment gas. The third treatment gas is in a plasma state formed by applying HF signal voltage to at least one gas selected from the group consisting of nitrogen ($N_2$), nitrogen oxide (NO), nitrogen dioxide ($NO_2$) and nitrous oxide ($N_2O$) between the electrodes 50. Thus, the upper surface of the silicon oxide layer is changed to silicon oxynitride. As a result, a good quality silicon oxynitride layer is formed. After the silicon oxynitride is formed (t7), the wafer boat 2 is removed from the processing room 41 and new wafers loaded therein.

In the method described as above, the silicon oxide layer is treated with an annealing process in the heating atmosphere, or nitrogen oxide gas atmosphere. Thus, the nitrogen oxide is dissolved and the nitrogen penetrates through into the silicon oxide layer, and is coupled with the dangling bond so as to end the dangling bond. As a result, the dangling bond at the interface between the silicon oxide layer and the silicon layer is reduced, and at least a portion of the silicon oxide layer near the interface is changed to silicon oxynitride. Then, a post-treatment is performed using plasma nitrogen gas and thus, the nitrogen penetrates through into the upper surface of the silicon oxide layer, thereby forming a silicon oxynitride layer.

In the insulating layer formed by the above method, the silicon oxide portion formed on the silicon wafer W reduces the chance of insulation breakage, and the leakage characteristic of the device is therefore improved. Further, the thermal budget of the process is reduced over conventional methods because the wafer W is not taken out of the processing room 41 after the oxidation process is performed on the wafer W to perform the annealing process.

Figure 4:
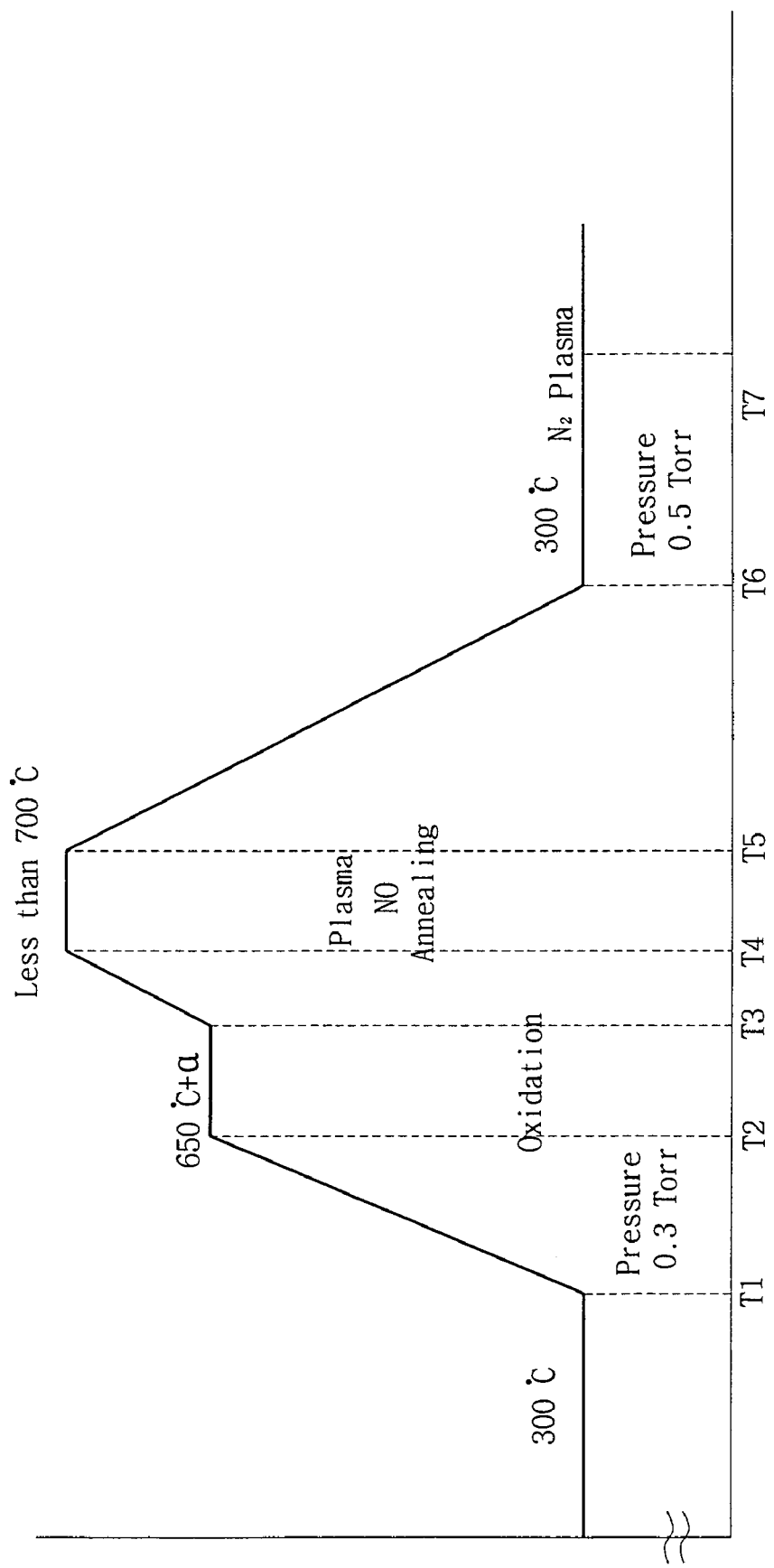

FIG. 4 is a diagram illustrating a temperature of the atmosphere inside a processing room and supply/stop states of a processing gas in accordance with time in a method of forming a silicon oxynitride layer according to another embodiment of the present invention.

After loading a wafer W into a processing room 41, the temperature is increased inside the processing room 41. At this time, the inside of the processing chamber 41 is maintained with a predetermined pressure, for example, 0.3 Torr.

When the inner temperature of the processing room 41 is a first treatment temperature, 650° C. or higher, for example, a point T2 of 650° C., an oxidation process as a first treatment process is performed. In the oxidation process, a first treatment gas is flowed into the processing chamber 41 to perform an oxidation. Thus, the surface of a silicon layer on the wafer W is oxidized, thereby forming a silicon oxide layer.

When the oxidation process is ended at a point T3, the atmosphere inside the processing room 41 is heated up to a temperature of a second treatment temperature. When the temperature of the processing room 41 is a second treatment temperature, 700° C. or lower, a point T4, an annealing process on the wafer W is performed. In the annealing process, a second treatment gas is flowed into the processing chamber 41 to perform a nitridation including nitrogen oxide gas plasma (NO). In this embodiment, the second treatment gas is composed of only nitrogen oxide gas plasma.

At a point T5 when the annealing process is ended, the supply of the nitrogen oxide gas is stopped. Then, the nitrogen oxide gas is exhausted, and the inner temperature of the processing room 41 is decreased to a third treatment temperature, for example, 300° C. (T6). Then, the processing room 41 is maintained with a pressure of 0.5 Torr or lower, and silicon oxynitride is formed on the wafer using a third treatment gas. The third treatment gas is in a plasma state by applying HF signal voltage to at least one gas selected from the group consisting of nitrogen ($N_2$), nitrogen oxide (NO), nitrogen dioxide ($NO_2$) and nitrous oxide ($N_2O$) between the electrodes 50. Thus, the upper surface of the silicon oxide layer is changed to silicon oxynitride. As a result, a good quality silicon oxynitride is formed. After the silicon oxynitride is formed (T7), the wafer boat 2 is removed from the processing room 41 and new wafers loaded for processing as above.

In the method described above, the silicon oxide layer is treated with an annealing process in the heating atmosphere, or nitrogen oxide plasma gas atmosphere. Thus, the silicon oxide layer is changed to silicon oxynitride by the nitrogen from the nitrogen oxide plasma gas. Here, the reason that the temperature of the annealing process is 700° C. or lower is that the atmosphere inside the processing room has sufficient energy since the nitrogen oxide gas is plasma. Because of this, there occurs little thermal budget in the wafer W.

Further, since a post-treatment is performed using a nitrogen plasma gas, nitrogen penetrates through into the upper surface of the silicon oxide layer, thereby forming a silicon oxynitride layer. Thus, there is a reduced chance of insulation breakage in the resulting insulating layer including the silicon oxynitride, and the leakage characteristic of the device is therefore improved.

According to the embodiments of the present invention as described above, the method of forming an insulating layer including silicon oxynitride by making plasma of a supplied gas and using the plasma gas, and the apparatus of forming the same, result in a thin and excellent insulating layer. Production yield is thereby improved.

As described above, since an annealing process is performed after an oxidation process, and the silicon oxynitride layer can be formed at a relatively low temperature using a nitrogen plasma gas after the annealing process, the silicon oxynitride layer formed provides the insulating layer with excellent electrical characteristics. Further, insulation breakage is reduced and its leakage characteristic is improved. Further, the batch-type vertical annealing treatment apparatus is effective to provide a high production yield.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A method of forming an insulating layer having silicon oxynitride comprising:

increasing a predetermined initial temperature up to a first treatment temperature, when a substrate to be treated is loaded into a processing room, with an atmosphere of the processing room maintained with a first pressure;

supplying a first treatment gas into the processing room to form a silicon oxide layer on the substrate to be treated, with an atmosphere of the processing room maintained at the first treatment temperature;

increasing a temperature of the processing room up to a second treatment temperature after the silicon oxide layer is formed, and supplying a second treatment gas for performing a nitridation inside the processing room, to perform an annealing process, thereby changing a portion of the silicon oxide layer to silicon oxynitride; and decreasing a temperature of the processing room to a third treatment temperature after the annealing process, and supplying a third treatment plasma gas into the processing room with the atmosphere of the processing room maintained with a second pressure, and performing a plasma treatment process for changing an additional portion of the silicon oxide layer to silicon oxynitride.

2. The method according to claim 1, wherein the first pressure is 0.3 Torr.

3. The method according to claim 1, wherein the first treatment temperature is 650° C. or higher.

4. The method according to claim 1, wherein the second treatment temperature is 700° C. or higher.

5. The method according to claim 1, wherein the second treatment gas is nitrogen oxide gas for performing nitridation of the silicon oxide layer.

6. The method according to claim 1, wherein the third treatment temperature is 300° C.

7. The method according to claim 1, wherein the second pressure is 0.5 Torr.

8. The method according to claim 1, wherein the third treatment gas is a plasma gas including at least one gas selected from the group consisting of nitrogen ($N_2$), nitrogen oxide (NO), nitrogen dioxide ($NO_2$) and nitrous oxide ($N_2O$).

9. The method according to claim 1, wherein the second treatment gas is plasma nitrogen oxide gas to perform nitridation of the silicon oxide layer, and the second treatment temperature is 700° C. or lower.

10. An apparatus of forming an insulating layer having silicon oxynitride on a surface of a substrate to be treated, the apparatus comprising:

a sealed processing room;

a heater heating an atmosphere of the processing room;

a support member mounted within the processing room and adapted to support a plurality of spaced substrates in parallel to one another;

a gas supply conduit supplying a treatment gas into the processing room;

an exhaust conduit vacuum-exhausting the inside of the processing room;

an inner tube coupled to the gas supply conduit and having a plurality of holes arranged within the processing room to spray a reaction gas generally perpendicular to a planar surface of the substrates; and an inlet pipe coupled to the gas supply conduit and having a plurality of holes arranged within the processing room in parallel to a long axis of the support member, said holes adapted to uniformly introduce a reaction gas generally parallel to the planar surface of the substrates.

11. The apparatus according to claim 10, further comprising a pair of electrodes disposed around the gas supply conduit for making plasma of a supplied gas.

12. The apparatus according to claim 10, further comprising a plasma system around the gas supply conduit for making plasma of a supplied gas.

13. The apparatus according to claim 10, wherein a pump system is connected to the exhaust conduit.

14. The apparatus according to claim 10, wherein the inner tube and inlet pipe are formed from quartz.

* * * * *